US 6,897,456 B2
May 24, 2005

(54) DIFFERENTIAL PUMPING SYSTEM AND EXPOSURE APPARATUS

(75) Inventors: Takayuki Hasegawa, Tokyo (JP); Akira Miyake, Tochigi (JP); Nobuaki Ogushi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 4 days.

(21) Appl. No.: 10/656,727

(22) Filed: Sep. 5, 2003

(65) Prior Publication Data
US 2004/0075063 A1 Apr. 22, 2004

(30) Foreign Application Priority Data
Sep. 6, 2002 (JP) ........................................ 2002-261796

(51) Int. Cl.[7] .................................................. A61N 5/00
(52) U.S. Cl. ............................... 250/492.2; 250/493.1; 250/504 R; 250/365; 250/372
(58) Field of Search .................... 250/504 R, 492.2, 250/493.1; 378/119, 34, 504 R, 365, 372

(56) References Cited

U.S. PATENT DOCUMENTS

| 4,996,700 | A | * | 2/1991 | Yamashita et al. | .......... 378/145 |
| 5,305,364 | A | * | 4/1994 | Mochiji et al. | .............. 378/34 |
| 5,491,534 | A | | 2/1996 | Shiozawa | |
| 5,846,678 | A | | 12/1998 | Nishigori et al. | |
| 5,963,616 | A | * | 10/1999 | Silfvast et al. | .............. 378/122 |
| 6,576,917 | B1 | * | 6/2003 | Silfvast | ................... 250/504 R |
| 2002/0168049 | A1 | * | 11/2002 | Schriever et al. | ........... 378/119 |
| 2004/0013226 | A1 | | 1/2004 | Bakker et al. | |
| 2004/0046949 | A1 | * | 3/2004 | Ohgushi et al. | .............. 355/53 |

FOREIGN PATENT DOCUMENTS

| EP | 001396760 A2 | * | 10/2004 | ............. G03F/7/20 |
| JP | 7-74092 | | 3/1975 | |
| JP | 02-156200 | | 6/1990 | |
| JP | 05-082417 | | 4/1993 | |
| JP | 7-263322 | | 10/1995 | |
| JP | 8-179514 | | 7/1996 | |
| JP | 2003-318107 | | 11/2003 | |

OTHER PUBLICATIONS

English Abstract for JP 02–156200.
English Abstract for JP 05–082417.
English Abstract for JP–07–263322 (Item A).

* cited by examiner

*Primary Examiner*—Nikita Wells
*Assistant Examiner*—Johnnie L Smith, II
(74) *Attorney, Agent, or Firm*—Morgan & Finnegan LLP

(57) ABSTRACT

A differential pumping system includes a first chamber for storing a light source that emits light, a second chamber that receives light from the first chamber, and a vacuum pump, provided between the first and second chambers, which includes a hollow shaft through which the light passes, and exhausts the hollow shaft.

15 Claims, 8 Drawing Sheets

DIFFERENTIAL PUMPING SYSTEM AND EXPOSURE APPARATUS

This application claims a benefit of foreign priority based on Japanese Patent Application No. 2002-261796, filed on Sep. 6, 2002, which is hereby incorporated by reference herein in its entirety as if fully set forth herein.

BACKGROUND OF THE INVENTION

The present invention relates to a light source and an illumination system for use with an extreme ultraviolet ("EUV") exposure apparatus that transfers a fine pattern in semiconductor manufacturing.

In manufacturing such a fine semiconductor device as a semiconductor memory and a logic circuit in photolithography technology, a reduction projection exposure apparatus has been conventionally employed which uses a projection optical system to project a circuit pattern formed on a mask (reticle) onto a wafer, etc. to transfer the circuit pattern.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution is. Along with recent demands for finer semiconductor devices, a shorter wavelength of ultraviolet light has been promoted from an ultra-high pressure mercury lamp (such as i-line with a wavelength of approximately 365 nm) to KrF excimer laser (with a wavelength of approximately 248 nm) and ArF excimer laser (with a wavelength of approximately 193 nm).

However, the photolithography using the ultraviolet light has the limit to satisfy the rapidly promoting fine processing of a semiconductor device, and a reduction projection optical apparatus using the EUV light with a wavelength of 10 to 15 nm shorter than that of the ultraviolet light (referred to as "EUV exposure apparatus") has been developed to efficiently transfer a very fine circuit pattern of 0.1 µm or less.

The EUV light source uses, for example, a laser plasma light source. It irradiates a highly intensified pulse laser beam to a target material put in a vacuum chamber to generate high-temperature plasma for use as the EUV light with a wavelength of about 13 nm emitted from this. The target material may use Xe gas, droplets, and clusters, and a metallic thin film, such as copper, tin, aluminum, etc., and is supplied to the vacuum chamber by gas jetting means and other means.

The laser plasma as one mode of the EUV light source irradiates the high-strength pulse laser light onto the target material and generates not only the EUV light from the target material, but also flying particles called debris, which causes pollution, damages and lowered reflectance of an optical element. Accordingly, a method have been conventionally proposed which mitigates influence of debris by providing a foil trap made of a porous material around the target material and circulating inert gas, such as He gas, as buffer gas.

Since He gas as well as Xe gas as the target material is essential to a light emitting section of the target material, the pressure in a vacuum chamber becomes about 10 Pa although a vacuum pump exhausts the chamber. The atmosphere of a stage subsequent to the light emitting section should be maintained as clean as possible, preferably with the degree of vacuum of about $10^{-7}$ Pa, for intended performance such as reflectance of the optical element, since the EUV light has low transmittance to the air and contaminates an optical element when reacted with a residual gas component (such as high molecule organic gas).

Differential pumping system have already been proposed which use a thin film window provided between a light emitting section and an optical element in a stage subsequent to the light emitting section (as seen in Japanese Patent Applications Publications Nos. 5-82417, and 2-156200). Several proposals of exposure dose control over a pulsed light source may be seen in U.S. Pat. No. 5,305,364.

It is difficult to manufacture and handle a self-supported filter material that has high transmittance and is applicable to a wavelength range of the EUV light. A differential pumping method is conceivable, as shown in FIG. 8, which uses a channel or orifice 3900 for differential pumping at a connection between a light source chamber 3110 that accommodates a light emitting section and an illumination system chamber 3120 that stores an optical element 3500. Here, FIG. 8 is a schematic structure of an EUV light source 3000 that uses a laser plasma light source.

The differential pumping using the orifice 15 generates a pressure difference of about $10^{-2}$ Pa between the light source chamber 3110 and an illumination system chamber 3120. When it is considered that the light source chamber 3110 has the pressure of about 10 Pa as discussed, the pressure in the illumination system 3120 becomes about $10^{-1}$ Pa, which is insufficient to maintain the performance such as the reflectance of the optical element 3500.

In order to obtain a desired pressure difference between the light source chamber 3110 and the illumination system 3120, it is conceivable to elongate the channel 3900 that connects the light source chamber 3110 and the illumination system chamber 3200. On the other hand, for enhanced use efficiency of the EUV light 3400, a spheroid condenser mirror 3600 should capture the EUV light generated from the target material as much as possible, for example, at about Π steradian. However, as the capture angle becomes large, it becomes difficult to elongate the channel 3900 and to obtain a desired pressure difference.

A demand to maintain the pressure in the illumination system chamber to be the degree of vacuum of about $10^{-7}$ Pa is common to a discharge method that generates the EUV light by circulating Xe gas, etc. in an electrode for discharging and generating plasma, as well as the laser plasma method.

Thus, it is a very difficult issue to increase the use efficiency of the EUV light while achieving the intended pressure difference in a differential pumping.

BRIEF SUMMARY OF THE INVENTION

Accordingly, it is an exemplary object of the present invention to provide a differential pumping system that has high differential pumping capacity without harming use efficiency of the EUV, and maintain performance of an optical element, such as reflectance.

A differential pumping system of one aspect according to the present invention includes a first chamber for storing a light source that emits light, a second chamber that receives light from the first chamber, and a vacuum pump, provided between the first and second chambers, which includes a hollow shaft through which the light passes, and exhausts the hollow shaft. The vacuum pump may include a vane that rotates around the hollow shaft. A wall surface of the hollow shaft may have an aperture, which has a vane section and exhausts gas molecules outside the shaft.

The differential pumping system may further include a first exhaust unit for exhausting the first chamber, and a second exhaust unit for exhausting the second chamber, wherein pressure of the second chamber is maintained lower than that of the first chamber. The light may be collimated and the hollow shaft may have a cylindrical shape. The light may be condensed, and the hollow shaft may be so tapered that a side of the first chamber is narrower than that of the second chamber. The differential pumping system may further include another vacuum pump for exhausting an atmosphere to the outside which has been exhausted by the vacuum pump provided between the first and second chambers. The light is, for example, EUV light.

An exposure apparatus of another aspect according to the present invention includes the above differential pumping system, an illumination optical system that introduces the light to a mask that forms a circuit pattern to be transferred onto an object, and a projection optical system that introduces the light from the mask onto the object, wherein the illumination optical system and projection optical system are installed in the second chamber.

A measurement system of still another aspect according to the present invention includes the above differential pumping system, a light intensity measuring apparatus for measuring light intensity from an object to be measured, an illumination optical system that introduces the light to the object, and a measurement optical system that introduces the light from the object to the light intensity measuring apparatus, wherein the light intensity measuring apparatus, illumination optical system and measurement optical system are installed in the second chamber.

A device fabrication method of another aspect of this invention includes the steps of exposing a plate by using the above exposure apparatus, and performing a predetermined process for the exposed object. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
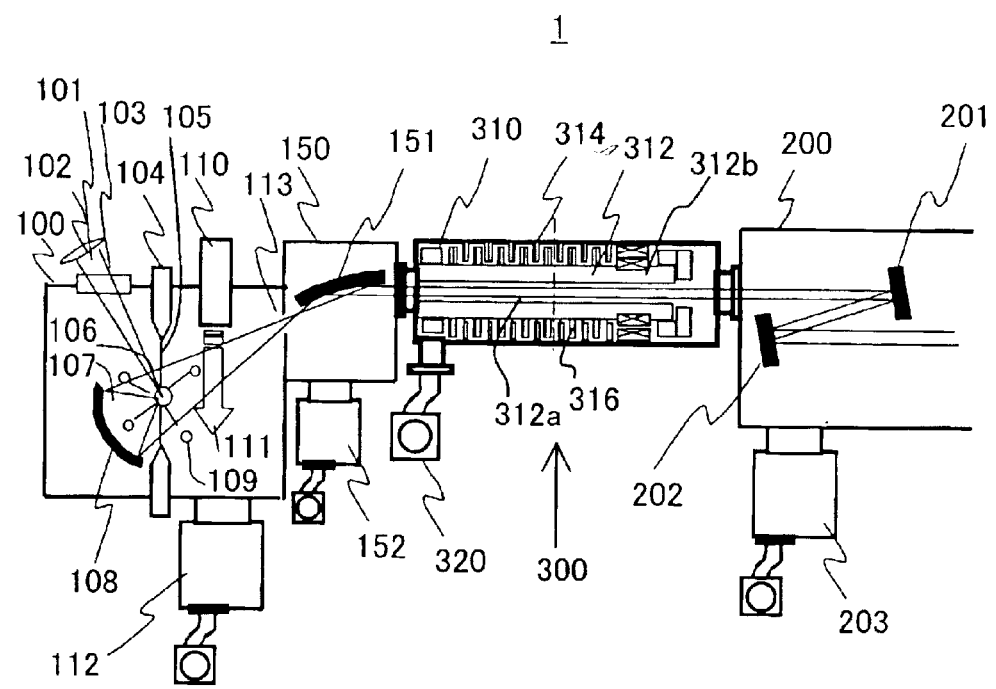
FIG. 1 is a schematic structure of a differential pumping system as one aspect according to the present invention.

With reference to accompanying drawings, a description will now be given of a differential pumping system of one embodiment according to the present invention. In each figure, the same element is designated by the same reference numeral, and a description thereof will be omitted. Here, FIG. 1 is a schematic structure of the differential pumping system of one embodiment according to the present invention.

Referring to FIG. 1, the differential pumping system 1 enables the pressure of an illumination system chamber 200 that is connectible to a light source chamber 100, to be smaller than that of the light source chamber 100 that accommodates plasma 106 as a light source for emitting the EUV light 107. The differential pumping system 1 is provided with an exhaust part 300 along an optical axis of the EUV light 107, which allows the EUV light 107 to pass to introduce the EUV light 107 to the second chamber 200, and exhausts gas molecules from the light source chamber 100 to the illumination system chamber 200 by exhausting the passage of the EUV light.

Pulsed laser 101 exited from a laser generator (not shown) is condensed on a target 105, such as Xe gas, supplied from a nozzle 104 via a condenser lens 102 and a transmission window 103, generating the plasma 106. The plasma 106 irradiates the EUV light 107, and a spheroid condenser mirror 108 condenses the EUV light 107 for improved use efficiency, and introduces it into the mirror chamber 150 that accommodates a mirror 151. The mirror converts the EUV light 107 into collimated light and introduces the collimated EUV light into a hollow part 312a of a rotational shaft 312, which will be described later.

As discussed, the plasma 106 generates not only the EUV light 107 but also flying particles called debris 109, which splashes and causes pollution, damages and lowered reflectance of the neighboring condenser mirror 108 and the mirror 151. Accordingly, a buffer gas supply unit 110 introduces He gas 111 into the light source chamber 100 to reduce splash of the debris 109 using flows of the He gas 111.

In order to reduce attenuation of the EUV light 107 and pollution and damages of the condenser mirror 108, the Xe gas as a target 105 and the He gas 111 as buffer gas are always supplied to the light source chamber 100 while a vacuum pump 113 exhausts the chamber 100. Therefore, the pressure of the light source chamber 100 becomes about 10 Pa. In order to prevent deterioration of the mirror 151, the pressure of the mirror chamber 150 should preferably low. Accordingly, an orifice is provided at a connection part with the light source chamber 100 and a pump 152.

An exhaust part 300 is implemented as a turbo molecular pump 310 having a rotational shaft 312 having a hollow part 312a through which the EUV light 107 passes so that an optical axis of the EUV light 107 is not shielded. A stator 314 is fixed onto the turbo molecular pump 310. The rotary shaft 312 has vanes 312b around the shaft, which has a blade section and exhausts gas molecules outside the rotational shaft 312. A roughing pump 320 exhausts gas compressed by the turbo molecular pump.

In this configuration, it is preferable that the EUV light 107 should be thin in order to further enhance the differential pumping performance of the turbo molecular pump 310, and it is preferable to maintain the low pressure environment of the illumination system chamber 200 and arrange the illumination system chamber 200 close to the light source chamber 100 to prevent pollution and damages of the optical elements 201 and 202 housed in the illumination system chamber 200.

On the other hand, it is preferable not to replace the optical elements 201 and 202 accommodated in the illumination system chamber 200, and the illumination system chamber 200 is always exhausted by a vacuum pump 203.

A description will now be given of the inventive differential pumping system 1. Gas molecules in the light source chamber 100 pass through the orifice 113 and enter the mirror chamber 150. Part of the gas molecules is exhausted by the pump 152, but other gas molecules enter the turbo molecular pump 310.

Figure 2:
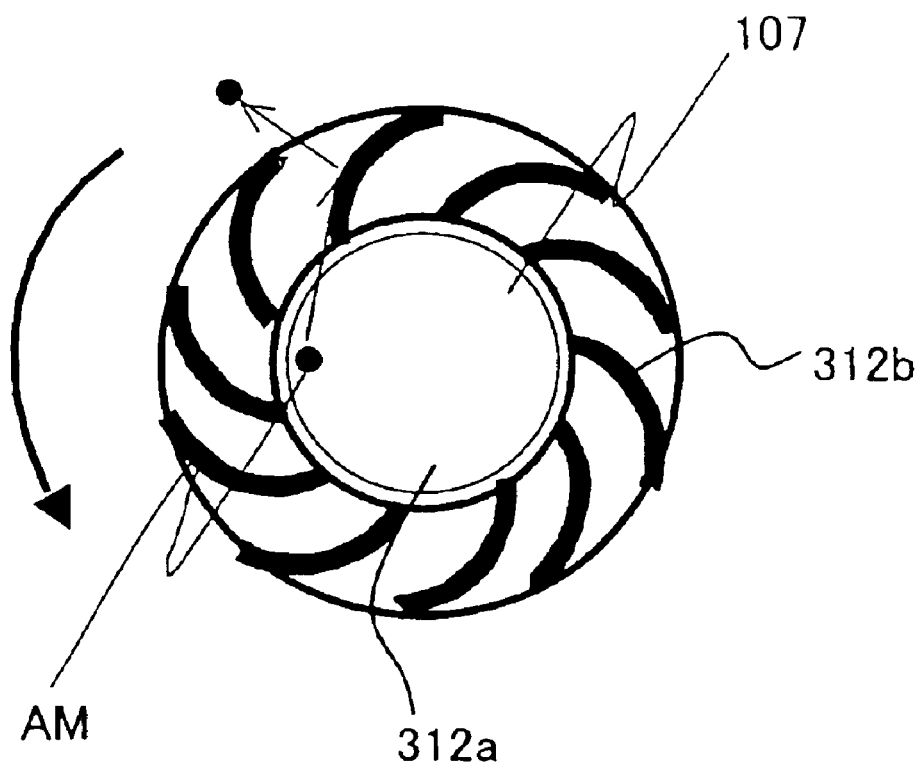
FIG. 2 is a schematic structure of one example of a rotational shaft of a turbo molecular pump shown in FIG. 1.

FIG. 2 is a schematic structure of one example of the rotational shaft 312 of the turbo molecular pump 310. An aperture for exhausting gas molecules to outside is provided in a wall surface of the rotational shaft 312 that includes the hollow part 312a and the vanes 312b are formed on a wall surface of the aperture. The rotational shaft 312 and the vanes 312b rotate at a high speed in an arrow direction shown in FIG. 2. The gas molecules AM that has entered the hollow part 312a in the rotational shaft 312 collide with the vanes 312b and scattered in a radial direction as shown by arrows in FIG. 2. The compressed gas molecules AM are exhausted to the outside by the roughing pump 320 as exhaust means. The scattered gas molecules AM passes through a section of the rotational shaft 312 and are exhausted to the outside of the rotational shaft 312. In this portion, the stators 314 and rotors 316 that may rotate around the rotational shaft 312 compress the gas molecules AM in the roughing pump 320. The compressed gas molecules AM are exhausted to the outside by the roughing pump 320 as exhaust means.

Figure 3:
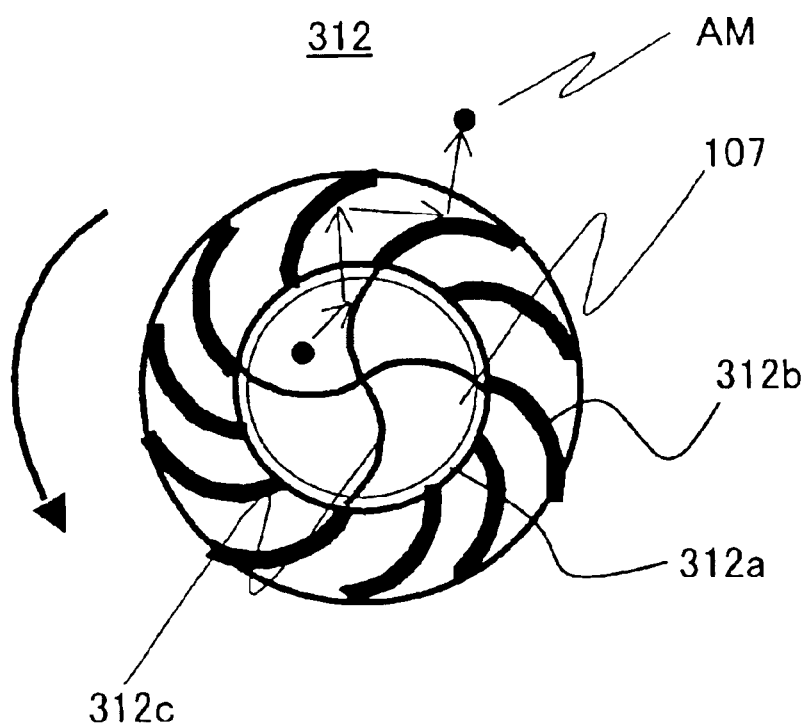
FIG. 3 is another schematic structure of one example of a rotational shaft of a turbo molecular pump shown in FIG. 1.

The rotational shaft 312 may include vanes 312c in the hollow part 312a, which exhaust the gas molecules AM to the outside of the rotational shaft 312. Here, FIG. 3 is a schematic structure of one example of the rotational shaft 312 of the turbo molecular pump 310. The vanes 312c shield the EUV light 107 but maintains its sectional area as small as possible so as not to reduce the use efficiency of the EUV light 107. The rotational shaft 312, and vanes 312b and 312c rotate at a high speed in an arrow direction shown in FIG. 3. Therefore, the gas molecules AM that move approximately parallel to the optical axis of the EUV light 107 collide with the vanes 312c and are scattered in a radial direction as shown by arrows in FIG. 3. The scattered gas molecules AM are further scattered by the vanes 312b, pass the section of the rotational shaft 312, and are exhausted outside the rotational shaft 312, providing the higher differential pumping performance.

The differential pumping performance will now be calculated when the exhaust part 300 (or turbo molecular pump 310) is applied. For simplicity purposes, it is assumed that there is no roughing pump 320 provided in the exhaust part 300.

The following equations are met where p1 (Pa) is the pressure of the mirror chamber 150, p2 (Pa) is the pressure of the illumination system chamber 200, S1 (m³/s) is a pumping speed at which the vacuum pump 152 exhausts the mirror chamber 150, S2 (m³/s) is a pumping speed at which the vacuum pump 203 exhausts the illumination system chamber 200, S12 (m³/s) is a pumping speed at which the turbo molecular pump 310 that connects the mirror chamber 150 and the illumination system chamber 200, Q1 (Pa·m³/s) is degas amount generated from the mirror chamber 150, Q2 (Pa·m³/s) is degas amount generated from the illumination system chamber 200, Q10 (Pa·m³/s) and Q20 (Pa·m³/s) are flow rate exhausted by respective vacuum pumps 152 and 203, and Q12 (Pa·m³/s) is the flow rate that flows through the turbo molecular pump 310:

$$Q1+Q2=Q10+Q20 \tag{1}$$

$$Q10=Q1+Q12 \tag{2}$$

$$Q10=S1 \cdot p1 \tag{3}$$

$$Q20=S2 \cdot p2 \tag{4}$$

$$Q12=S12 \cdot p2 \tag{5}$$

Equations 6 and 7 are obtained as follows from Equations 1 to 5 by deleting Q10, Q20 and Q12 and simplifying equations with respect to p1 and p2 by setting Q1>>Q2:

$$p1=(S2 \cdot Q1+S12 \cdot Q1+S12 \cdot Q2)/(S1 \cdot S2+S1 \cdot S12) \approx Q1/S1 \tag{6}$$

$$p2=Q2/(S2+S12) \tag{7}$$

For the pressure p1=10 (Pa), the pumping speed S1=S2=1 (m³s) (1000·1/s), the pumping speed S12=0.3 (m³/s) (300·1/s), the degas amounts Q1=10 (Pa·m³/s) and Q2=10⁻⁵ (Pa·m³/s), then $p2=10^{-5}(1+0.3)=7.7 \cdot 10^{-6}$ (Pa) and $p1/p2>10^6$:

Thus, as discussed, since the turbo molecular pump 310 uses the rotational shaft that has the hollow part 312a so as not to shield the optical axis of the EUV light 107 as illumination light, the differential pumping performance may improve and prevent pollution and deterioration of the optical elements 201 and 202 housed in the illumination system chamber 200.

The differential pumping system 1 is useful for applications using a point source X ray source, such as a reflectometer, a wave front measurement device, a microscope, a shape measurement device, medical equipment, a chemical composition analyzer, and a structural analyzer.

Figure 4:
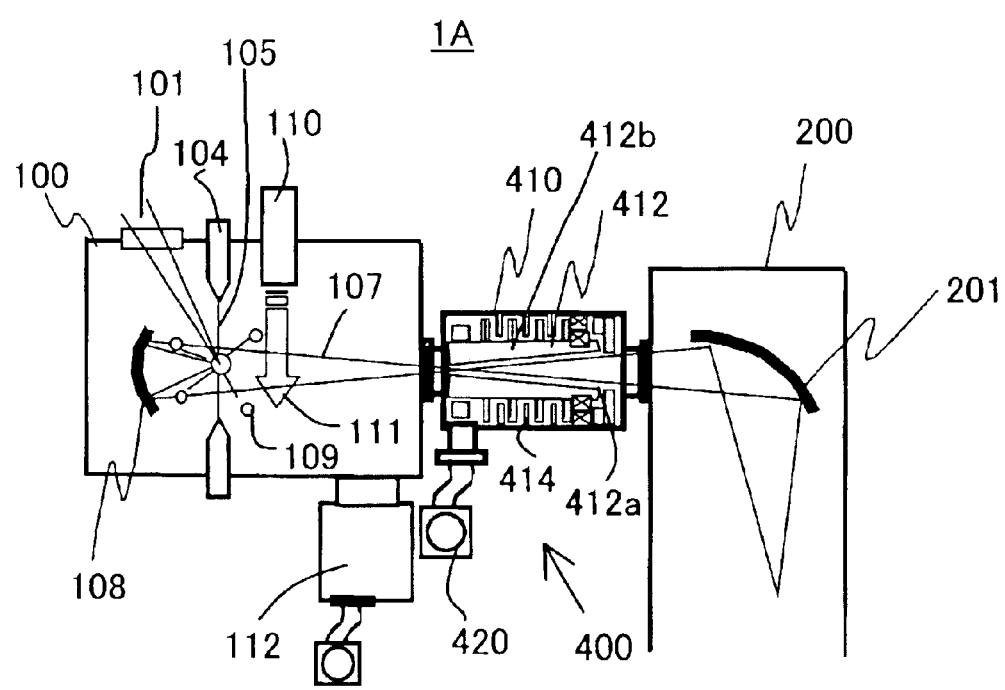
FIG. 4 is a schematic structure of a differential pumping system as a variation according to the present invention.

A description will now be given of a differential pumping system 1A as a variation of the differential pumping system 1, with reference to FIG. 4. FIG. 4 is a schematic structure of the differential pumping system 1A of one embodiment according to the present invention. The differential pumping system 1A is similar to the differential pumping system 1, but different from it in an exhaust part 400.

The differential pumping system 1A provides the exhaust part 400 between the light source chamber 100 and the illumination system chamber 200. The EUV light 107 is incident upon the illumination system chamber 200 once condensed by the condenser mirror 108.

The exhaust part 400 is implemented as a turbo molecular pump 310 having a rotational axis 412 having a hollow part 312a that opens like a taper corresponding to a collection angle of the EUV light 107 so as not to prevent the EUV light 107 from passing. The pressure of the light source chamber 100 corresponds to a molecular flow region, and thus it is effective that the hollow part 412a has the smallest opening at a side of the light source chamber 100. In other words, a position of a condensed point 107a of the EUV light 107 corresponds to the opening of the hollow part 412a closest to the light source chamber 100.

The turbo molecular pump 410 fixes stators 414. The rotational shaft 412 has vanes 412b around it, which have a blade section and exhaust gas molecules to the outside of the rotational shaft 412. The roughing pump 420 exhausts the gas compressed by the turbo molecular pump 410.

Such a configuration may provide the differential pressure between the light source chamber 100 and the illumination system chamber 200, and reduces the pressure of the entire illumination system chamber 200. Therefore, it is possible to prevent pollution and deterioration of all the optical elements housed in the illumination system mirror 200.

A description will be given of an exemplary inventive exposure apparatus 800 that uses the inventive differential pumping system with reference to FIG. 5. Here, FIG. 5 is a schematic structure of the inventive exposure apparatus 800 of one embodiment.

The inventive exposure apparatus 800 is a projection exposure apparatus that uses EUV light with a wavelength of 13.4 nm as exposure light for step-and-scan or step-and-repeat exposure of a circuit pattern formed on the mask 820 onto an object 840 to be exposed. This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Figure 5:
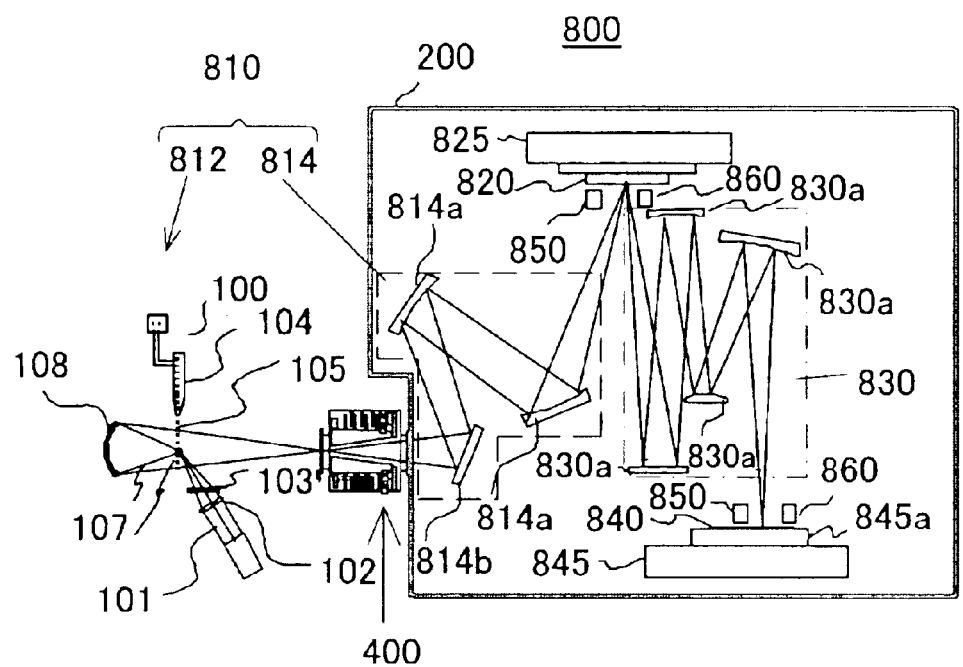
FIG. 5 is a schematic structure of an exposure apparatus of one embodiment according to the present invention.

Referring to FIG. 5, the exposure apparatus 800 includes an illumination apparatus 810, a mask 820, a mask stage 825 that mounts the mask 820, a projection optical system 830, an object to be exposed 840, a wafer stage 845 that mounts the object 840, an alignment detecting mechanism 850, and a focus position detecting mechanism 860.

The illumination apparatus 810 uses arc-shaped EUV light, for example, with a wavelength of 13.4 corresponding to an arc-shaped field of the projection optical system 830 to illuminate the mask 820, and includes an EUV light source 812 and illumination optical system 814. The inventive differential pumping system 1 or 1A is applicable to a connection between the EUV light source 812 and the illumination optical system 814 of the subsequent stage in the illumination apparatus 810, and the differential pumping system 1 or 1A may maintain performance, such as reflectance of an optical element of the illumination optical system 814 in a low pressure atmosphere for the illumination optical system 814 without damaging use efficiency of the EUV light. The EUV light source 812 may use any of the above structures, and a detailed description will be omitted.

The illumination optical system 814 includes a condenser mirror 814a, an optical integrator 814b, etc. The condenser mirror 814a serves to collect the EUV light that is isotropically irradiated from the laser plasma. The optical integrator 814b serves to uniformly illuminate the mask 820 with a predetermined NA. An aperture to limit the illumination area to an arc shape is also provided.

The mask 820 is a reflection-type mask that forms a circuit pattern or image to be transferred, and supported and driven by the mask stage 825. The diffracted light from the mask 820 is reflected by the projection optical system 830 and projected onto the object 840. The mask 820 and the object 840 are arranged in an optically conjugate relationship. The exposure apparatus 800 is a step-and-scan exposure apparatus, and projects a reduced size of the pattern on the mask 820 on the object 840 by scanning the mask 820 and the object 840.

The mask stage 825 supports the mask 820 and is connected to a moving mechanism (not shown). The mask stage 825 may use any structure known in the art. A moving mechanism (not shown) may include a linear motor etc., and drives the mask stage 825 at least in a direction X and moves the mask 820. The exposure apparatus 800 synchronously scans the mask 820 and the object 840. The exposure apparatus 800 assigns the direction X to scan the mask 820 or the object 840, a direction Y perpendicular to the direction X, and a direction Z perpendicular to the mask 820 or the object 840.

The projection optical system 830 uses plural multilayer mirrors 830a to project a reduced size of a pattern formed on the mask 820 onto the object 840. The number of mirrors is about four to six. For wide exposure area with the small number of mirrors, the mask 820 and object 840 are simultaneously scanned to transfer a wide area that is an arc-shaped area or ring field apart from the optical axis by a predetermined distance. The projection optical system 830 has a NA of about 0.1 to 0.3.

The instant embodiment uses a wafer as the object to be exposed 840, but it may include a spherical semiconductor and liquid crystal plate and a wide range of other objects to be exposed. Photoresist is applied onto the object 840. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

An object to be exposed 840 is held onto the wafer stage 845 by a wafer chuck. The wafer stage 845 moves the object 840, for example, using a linear motor in XYZ directions. The mask 820 and the object 840 are synchronously scanned. The positions of the mask stage 825 and wafer stage 845 are monitored, for example, by a laser interferometer, and driven at a constant speed ratio.

The alignment detection mechanism 850 measures a positional relationship between the position of the mask 820 and the optical axis of the projection optical system 830, and a positional relationship between the position of the object 840 and the optical axis of the projection optical system 830, and sets positions and angles of the mask stage 825 and the wafer stage 845 so that a projected image of the mask 820 may be positioned in place on the object 840.

A focus detection optical system 860 measures a focus position in the direction Z on the object 840 surface, and control over a position and angle of the wafer stage 845 may always maintain the object 840 surface at an imaging position of the projection optical system 830 during exposure.

In exposure, the EUV light emitted from the illumination apparatus 810 illuminates the mask 820, and the projection optical system 830 images a pattern formed on the mask 820 onto the object 840 surface. The instant embodiment uses an arc or ring shaped image plane, scans the mask 820 and object 840 at a speed ratio corresponding to a reduction ratio to expose the entire surface of the mask 820. The exposure apparatus 800 may improve the use efficiency of the EUV light, and reduces the pressure of the subsequent stage to the EUV light source 812 down to the high vacuum state. Thus, the exposure apparatus 800 may maintain the optical performance of the optical element, and provide exposure with good imaging performance and throughput.

Figure 6:
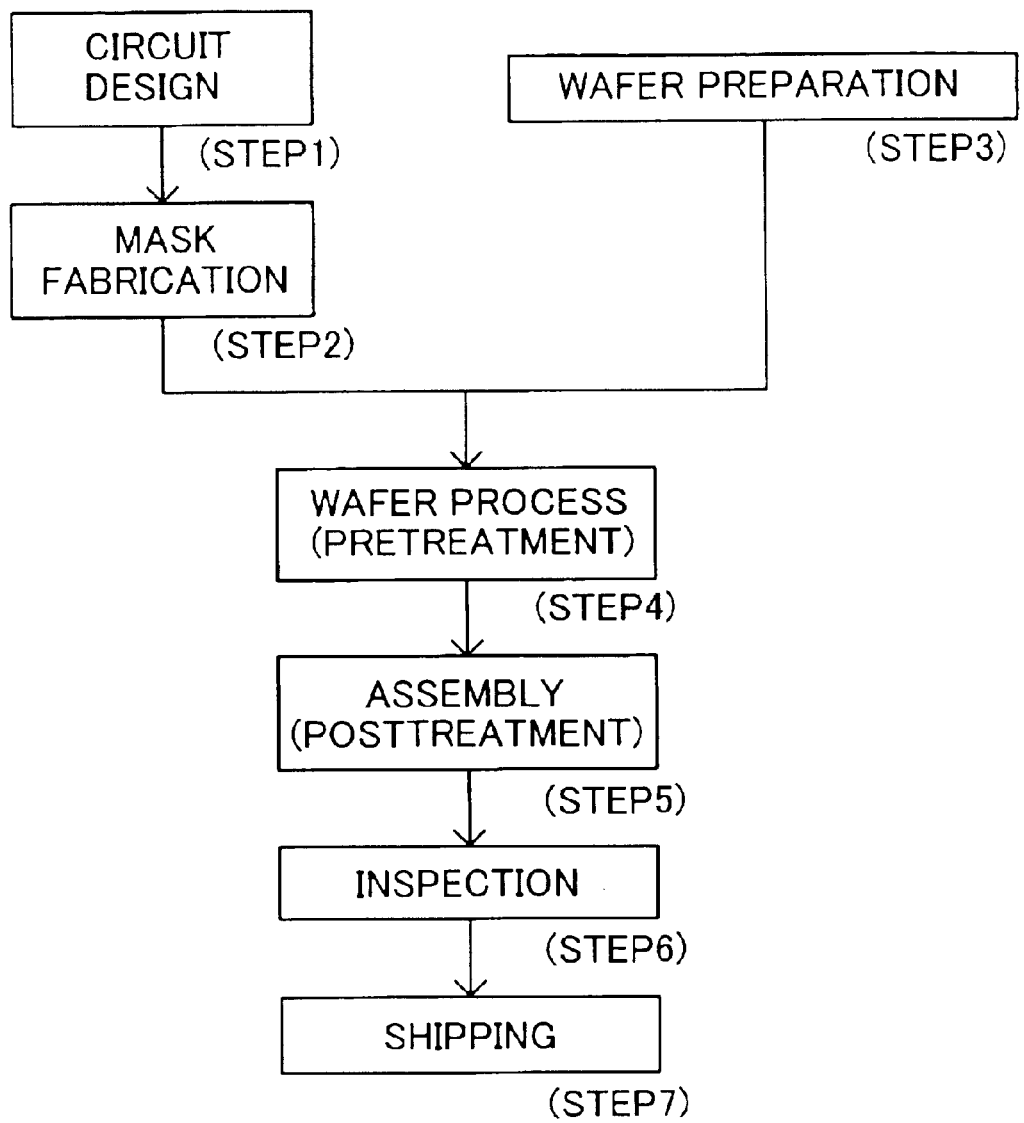
FIG. 6 is a flowchart for explaining how to fabricate devices (such as semiconductor chips such as ICs and LCDs, CCDs, and the like).
Figure 7:
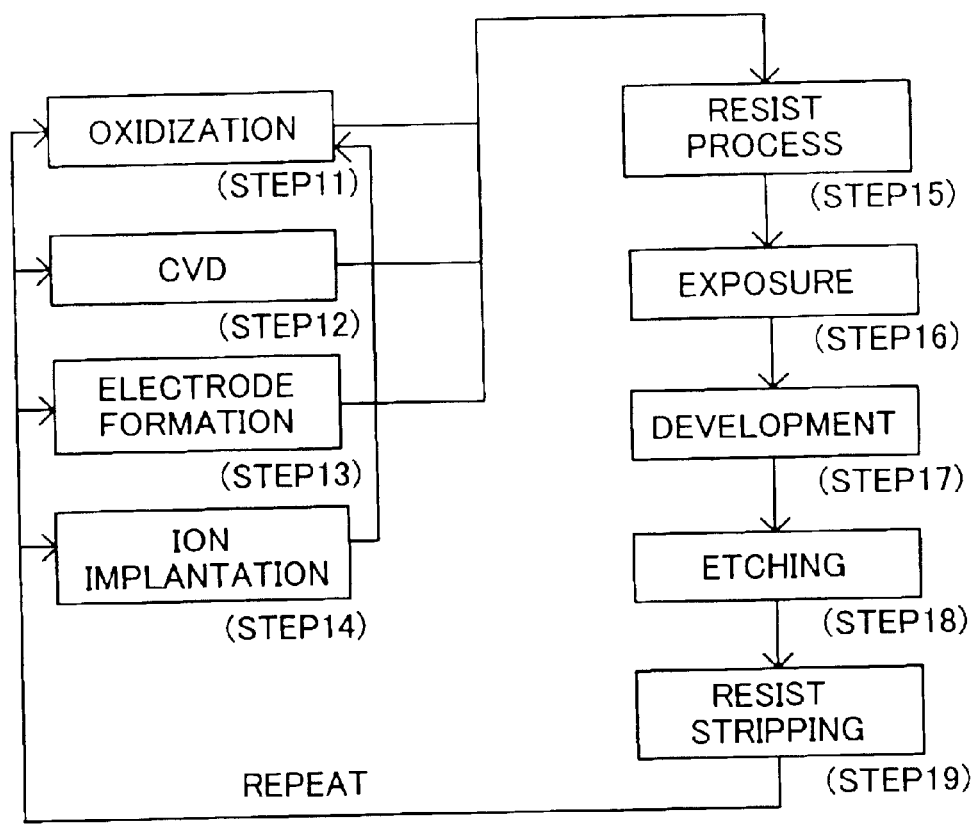
FIG. 7 is a detail flowchart of a wafer process as Step 4 shown in FIG. 6.
Figure 8:
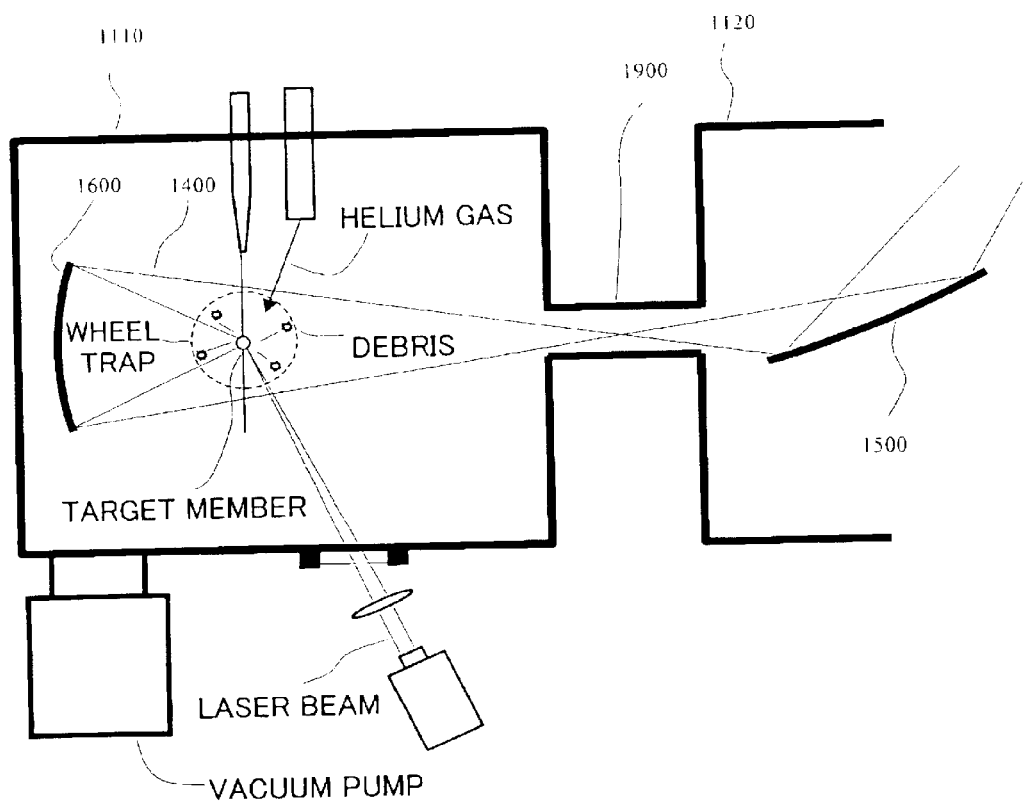
FIG. 8 is a schematic structure of an EUV light source that uses a laser plasma light source.

Referring now to FIGS. 6 and 7, a description will be given of an embodiment of a device fabricating method using the above exposure apparatus 800. FIG. 6 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 7 is a detailed flowchart of the wafer process in Step 4 in FIG. 6. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 800 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture a higher quality device than the conventional method. The device fabrication method using the exposure apparatus 800 and devices as the resultant products would constitute one aspect of the present invention.

Further, the present invention is not limited to these preferred embodiments, and various variations and modifications may be made without departing from the scope of the present invention.

For example, the above differential pumping system 1 or 1A is applicable to a measurement system. A reflectometer as one example of this measurement system includes, in addition to the above differential pumping system, a light intensity measuring apparatus for measuring light intensity from a multilayer mirror for EUV light as an object to be measured, an illumination optical system that introduces the light to the multilayer mirror, and a measurement optical system that introduces the light from the multilayer mirror to the light intensity measuring apparatus, wherein the light intensity measuring apparatus, illumination optical system and measurement optical system are installed in the above chamber 200.

The inventive differential pumping system may thus provide high differential pumping performance without harming the use efficiency of the EUV light and maintain performance of an optical element, such as reflectance.

What is claimed is:

1. A differential pumping system comprising:
   a first chamber for storing a light source that emits light;
   a second chamber that receives light from the first chamber; and
   a vacuum pump, provided between said first and second chambers, which includes a hollow shaft through which the light passes, and exhausts the hollow shaft.

2. A differential pumping system according to claim 1, wherein a wall surface of the hollow shaft has an aperture, which has a vane section and exhausts gas molecules outside the shaft.

3. A differential pumping system according to claim 1, wherein said vacuum pump includes a vane that rotates in the hollow shaft.

4. A differential pumping system according to claim 1, further comprising:
   a first exhaust unit for exhausting said first chamber; and
   a second exhaust unit for exhausting said second chamber, wherein pressure of the second chamber is lower than that of the first chamber.

5. A differential pumping system according to claim 1, wherein the light is collimated and the hollow shaft has a cylindrical shape.

6. A differential pumping system according to claim 1, wherein the light is condensed, and the hollow shaft is so tapered that a side of the first chamber is narrower than that of the second chamber.

7. A differential pumping system according to claim 1, further comprising another vacuum pump for exhausting an atmosphere to the outside which has been exhausted by the vacuum pump provided between said first and second chambers.

8. A differential pumping system according to claim 1, wherein the light is EUV light.

9. An exposure apparatus comprising:
   a differential pumping system that includes a first chamber for storing a light source that emits light, a second chamber that receives light from the first chamber, and a vacuum pump, provided between the first and second chambers, which includes a hollow shaft through which the light passes, and exhausts the hollow shaft;
   an illumination optical system that introduces the light to a mask that forms a circuit pattern to be transferred onto an object; and
   a projection optical system that introduces the light from the mask onto the object,
   wherein said illumination optical system and projection optical system are installed in the second chamber.

10. A measurement system comprising:
    a differential pumping system that includes a first chamber for storing a light source that emits light, a second chamber that receives light from the first chamber, and a vacuum pump, provided between the first and second chambers, which includes a hollow shaft through which the light passes, and exhausts the hollow shaft;
    a light intensity measuring apparatus for measuring light intensity from an object to be measured;
    an illumination optical system that introduces the light to the object; and
    a measurement optical system that introduces the light from the object to said light intensity measuring apparatus,
    wherein said light intensity measuring apparatus, illumination optical system and measurement optical system are installed in the second chamber.

11. A device fabrication method comprising the step of:
    exposing an object to be exposed, using an exposure apparatus; and
    performing a predetermined process for the object exposed,
    wherein an exposure apparatus includes:
    a differential pumping system that includes a first chamber for storing a light source that emits light, a second chamber that receives light from the first chamber, and a vacuum pump, provided between the first and second chambers, which includes a hollow shaft through which the light passes, and exhausts the hollow shaft;
    an illumination optical system that introduces the light to a mask that forms a circuit pattern to be transferred onto an object; and a projection optical system that introduces the light from the mask onto the object, wherein said illumination optical system and projection optical system are installed in the second chamber.

12. A differential pumping system comprising:

a first chamber for storing a mirror that reflects light from a light source;

a second chamber that receives light from the first chamber; and a vacuum pump, provided between said first and second chambers, which includes a hollow shaft through which the light passes, and exhausts the hollow shaft.

13. An exposure apparatus comprising:

a differential pumping system that includes a first chamber for storing a mirror that reflects light from a light source, a second chamber that receives light from the first chamber, and a vacuum pump, provided between said first and second chambers, which includes a hollow shaft through which the light passes, and exhausts the hollow shaft;

an illumination optical system that introduces the light to a mask that forms a circuit pattern to be transferred onto an object; and a projection optical system that introduces the light from the mask onto the object, wherein said illumination optical system and projection optical system are installed in the second chamber.

14. A measurement system comprising:

a differential pumping system that includes a first chamber for storing a mirror that reflects light from a light source, a second chamber that receives light form the first chamber, and a vacuum pump, provided between said first and second chambers, which includes a hollow shaft through which the light passes, and exhausts the hollow shaft;

a light intensity measuring apparatus for measuring light intensity from an object to be measured;

an illumination optical system that introduces the light to the object; and a measurement optical system that introduces the light from the object to said light intensity measuring apparatus, wherein said light intensity measuring apparatus, illumination optical system and measurement optical system are installed in the second chamber.

15. A device fabrication method comprising the step of:

exposing an object to be exposed, using an exposure apparatus; and performing a predetermined process for the object exposed, wherein an exposure apparatus includes:

a differential pumping system that includes a first chamber for storing a mirror that reflects light from a light source, an second chamber that receives light from the first chamber, and a vacuum pump, provided between said first and second chambers, which includes a hollow shaft through which the light passes, and exhausts the hollow shaft;

an illumination optical system that introduces the light to a mask that forms a circuit pattern to be transferred onto an object; and a projection optical system that introduces the light from the mask onto the object, wherein said illumination optical system and projection optical system are installed in the second chamber.

* * * * *